(12) United States Patent
Chuma

(10) Patent No.: US 8,241,760 B2
(45) Date of Patent: Aug. 14, 2012

(54) JOINT STRUCTURE, JOINING METHOD, WIRING BOARD AND METHOD FOR PRODUCING THE SAME

(75) Inventor: Toshiaki Chuma, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 155 days.

(21) Appl. No.: 12/440,986

(22) PCT Filed: Sep. 14, 2006

(86) PCT No.: PCT/JP2006/318279
§ 371 (c)(1),
(2), (4) Date: Mar. 12, 2009

(87) PCT Pub. No.: WO2008/032386
PCT Pub. Date: Mar. 20, 2008

(65) Prior Publication Data
US 2009/0264028 A1  Oct. 22, 2009

(51) Int. Cl.
*B32B 15/04* (2006.01)
*B32B 15/20* (2006.01)
*H05K 3/00* (2006.01)
*B23K 20/00* (2006.01)
*H01R 4/00* (2006.01)
*H01R 4/02* (2006.01)

(52) U.S. Cl. .......... 428/674; 428/646; 428/647; 29/843; 228/193; 228/262.61; 361/771; 361/779; 439/874; 439/876

(58) Field of Classification Search .............. 428/610, 428/646, 647, 674, 675
See application file for complete search history.

(56) References Cited

U.S. PATENT DOCUMENTS

| | | | |
|---|---|---|---|
| 5,939,789 A | 8/1999 | Kawai et al. | |
| 2002/0090756 A1* | 7/2002 | Tago et al. | ............ 438/108 |
| 2003/0156969 A1 | 8/2003 | Choi et al. | |
| 2005/0275096 A1 | 12/2005 | Zeng et al. | |

FOREIGN PATENT DOCUMENTS

| | | |
|---|---|---|
| JP | 8-316598 | 11/1996 |
| JP | 11-54934 | 2/1999 |
| JP | 2003-332731 | * 11/2003 |
| JP | 2004-221567 | 8/2004 |
| JP | 2004-311909 | 11/2004 |
| JP | 2005-039136 | * 2/2005 |
| JP | 2006-82119 | 3/2006 |

OTHER PUBLICATIONS

Machine Translation, Chuma et al., JP 2005-039136, Feb. 2005.*
Machine Translation, Kondo et al., JP 2004-311909, Nov. 2004.*
Machine Translation, Okada, JP 2004-221567, Aug. 2004.*
Machine Translation, Takaoka et al., JP 2003-332731, Nov. 2003.*
International Search Report, (Oct. 2006).
Supplementary European Search Report for Application No. EP 06 79 7991 dated Sep. 18, 2009.
Japanese Office Action issued Mar. 21, 2012 for Application No. 2008-534188.

* cited by examiner

*Primary Examiner* — Michael La Villa
(74) *Attorney, Agent, or Firm* — Smith, Gambrell & Russell, LLP

(57) ABSTRACT

A joint structure of the present invention includes a conductive member containing copper as a major component thereof, an electrode member containing copper as a major component thereof, and a joint portion formed by fusion welding the conductive member and the electrode member with a brazing material containing tin as a major component thereof and containing substantially no copper, wherein the amount of copper atoms contained in the alloy in the central part of the joint portion is higher than that in the outer circumference part.

13 Claims, 6 Drawing Sheets

JOINT STRUCTURE, JOINING METHOD, WIRING BOARD AND METHOD FOR PRODUCING THE SAME

TECHNICAL FIELD

The present invention relates to a joint structure and a joining method, and a wiring board and a method for producing the same.

BACKGROUND ART

Recently, as electronic devices are highly densified, circuit substrates such as a flexible print wiring board used in those electronic devices are multi-layered. As one of the laminating techniques for forming a multi-layer circuit substrate, a build-up method has been employed. The build-up method is a method for laminating a resin layer formed of only a resin and conductive layers so that the interlayer connection is established between the conductive layers through the single resin layer.

In general, this build-up method includes a method for interlayer-connecting conductive layers after via holes are formed on a resin layer and a method for laminating a resin layer after joint portions are formed on a conductive layer. The joint portions between the conductive layers are formed either by plating the via holes or by using a conductive paste.

As a technique capable of forming a stacked via structure and achieving densification and simplification of the wiring design, there is known a method which accomplishes electrical connection between conductive layers by forming micro via holes for the electrical connection on a resin layer by laser irradiation and filling the via holes with a conductive adhesive such as copper paste, in which the conductive adhesive provides the electrical connection between the conductive layers (see, for example, Japanese Patent Laid-Open Publication No. Hei 8-316598).

However, in this method, since the electrical connection between the layers is accomplished by the conductive adhesive, the reliability is often not sufficient. Also, in order to fill the micro-via holes with the conductive adhesive, a highly advanced technique is required. Further, since the conductive adhesive has a relatively high on-resistance, when it is filled in the micro-via holes, the on-resistance is increased. Therefore, it is difficult to use such a conductive adhesive for the electrical interlayer connection between substrates where a wiring is made at a high density.

Accordingly, instead of the technique of filling the via-holes with the conductive adhesive, a technique of using metallic protrusions (conductive posts) has been used. As the technique of using the conductive posts, there is known a method of mechanically connecting the conductive posts with a conductive pad without using an interlayer adhesive (see, for example, Japan Patent Laid-Open Publication No. Hei 11-54934).

However, this method involves a problem in that it is difficult to completely eliminate the interlayer adhesive between the conductive posts and the conductive pad, such that the reliability is not sufficient.

Also, when the structure is re-heated for the mounting of parts, after the interlayer connection is formed once, there is a case that the solder formed for the interlayer connection is re-melted, deformed and moved, thereby deteriorating the reliability of the interlayer connection.

DISCLOSURE OF THE INVENTION

It is an object of the present invention to provide a joint structure having a high connection reliability between a conductive member and an electrode member and a superior thermal resistance of a joint portion between layers, and a joining method using the joint structure.

Also, it is another object of the present invention to provide a wiring board comprising a joint structure having a high connection reliability between a conductive member and an electrode member and a superior thermal resistance of a joint portion between layers and a method for producing the same.

In order to achieve the object, the present invention includes the following features (1) to (16)

(1) A joint structure comprising a conductive member containing copper as a major component thereof, an electrode member containing copper as a major component thereof, and a joint portion formed by fusion welding the conductive member and the electrode member with a brazing material containing tin as a major component thereof and containing substantially no copper, wherein the amount of copper atoms contained in the alloy in the central part of the joint portion is higher than that in the outer circumference part.

(2) The joint structure according to the above feature (1), wherein the copper atoms existing in the central part of the joint portion are formed by diffusing the copper atoms contained in the conductive member and/or the electrode member.

(3) The joint structure according to the above feature (1) or (2), wherein the amount of copper atoms contained in the alloy in the central part of the joint portion is 30 atom % or more.

(4) The joint structure according to any one of the above features (1) to (3), wherein the difference [S1–S2] of the amount [S1] of copper atoms contained in the alloy in the in the central part of the joint portion and the amount [S2] of copper atoms contained in the alloy in the outer circumference part of the joint portion is 10 atom % or more.

(5) The joint structure according to any one of the above features (1) to (4), wherein the conductive member is a protruding electrode.

(6) The joint structure according to any one of the above features (1) to (6), wherein the brazing material further comprises silver.

(7) A wiring board comprising the joint structure according to any one of the above features (1) to (6).

(8) A joining method which comprises fusion welding a conductive member containing copper as a major component thereof and an electrode member containing copper as a major component thereof with a brazing material containing tin as a major component thereof and containing substantially no copper, wherein the molten state of the brazing material in the fusion welding is controlled so that the amount of copper atoms contained in the alloy in the central part of the brazing material after the fusion welding is higher than that in the outer circumference part.

(9) The joining method according to the above feature (8), wherein the fusion welding state is maintained at a temperature which is 25° C. higher than the melting point of the brazing material.

(10) The joining method according to the above feature (8) or (9), wherein the fusion welding state is maintained for 60 seconds at a temperature which is higher than the melting point of the brazing material.

(11) A joining method which comprises fusion welding a conductive member containing copper as a major component thereof and an electrode member containing copper as a major component thereof with a brazing material containing tin as a major component thereof and containing substantially no copper, the joining method comprising the steps of:

a first step in which copper atoms contained in the conductive member are diffused into the brazing material so as to alloy the copper contained in the conductive member and the tin contained in the brazing material, and copper atoms contained in the electrode member are diffused into the brazing material so as to alloy the copper contained in the electrode member and the tin contained in the brazing material to thereby form a film shaped alloy part where the amount of copper atoms contained in the alloy in the brazing material after the fusion welding is 15 atom % or less; and a second step in which the alloying of the copper whose atoms are diffused and the tin of the brazing material is further facilitated to thereby form island shaped alloy parts where the amount of copper atoms contained in the alloy in the brazing material after the fusion welding is 15 atom % or less

(12) The joining method according to the above feature (11), further comprising a third step in which the alloying of the copper whose atoms are diffused and the tin of the brazing material is facilitated so that the amount of copper atoms contained in the alloy in the central part of the brazing material after the fusion welding is higher than that in the outer circumference part.

(13) The joining method according to any one of the above features (9) to (12), wherein the brazing material in the first step is in a molten state.

(14) The joining method according to any one of the above features (9) to (13), wherein the brazing material in the second step is in a molten state.

(15) The joining method according to any one of the above features (9) to (14), wherein the brazing material in the third step is in a molten state.

(16) A method for producing a wiring board comprising a first substrate including a conductive member containing copper as a major component thereof and a second substrate including an electrode member containing copper as a major component thereof, wherein the first substrate and the second substrate are joined together by the joining method according to any one of the above features (9) to (15).

BEST MODE FOR PRACTICING THE INVENTION

Now, the joint structure and the joining method according to the present invention will be described.

The joint structure according to the present invention comprises a conductive member containing copper as a major component thereof, an electrode member containing copper as a major component thereof, and a joint portion formed by fusion welding the conductive member and the electrode member with a brazing material containing tin as a major component thereof and containing substantially no copper, wherein the amount of copper atoms contained in the alloy in the central part of the joint portion is higher than that in the outer circumference part.

Also, the joining method according to the present invention comprises fusion welding a conductive member containing copper as a major component thereof and an electrode member containing copper as a major component thereof with a brazing material containing tin as a major component thereof and containing substantially no copper, wherein the molten state of the brazing material in the fusion welding is controlled so that the amount of copper atoms contained in the alloy in the central part of the brazing (soldering) material after the fusion welding is higher than that in the outer circumference part.

Further, the wiring board according to the present invention comprises the joint structure as described above.

In addition, the present invention provides a method for producing a wiring board comprising a first substrate including a conductive member containing copper as a major component thereof and a second substrate including an electrode member containing copper as a major component thereof, wherein the first substrate and the second substrate are joined to each other by the joining method as described above.

FIG. 1 to FIG. 4 are cross-sectional views to explain the process for joining a conductive member and an electrode member.

Figure 5:
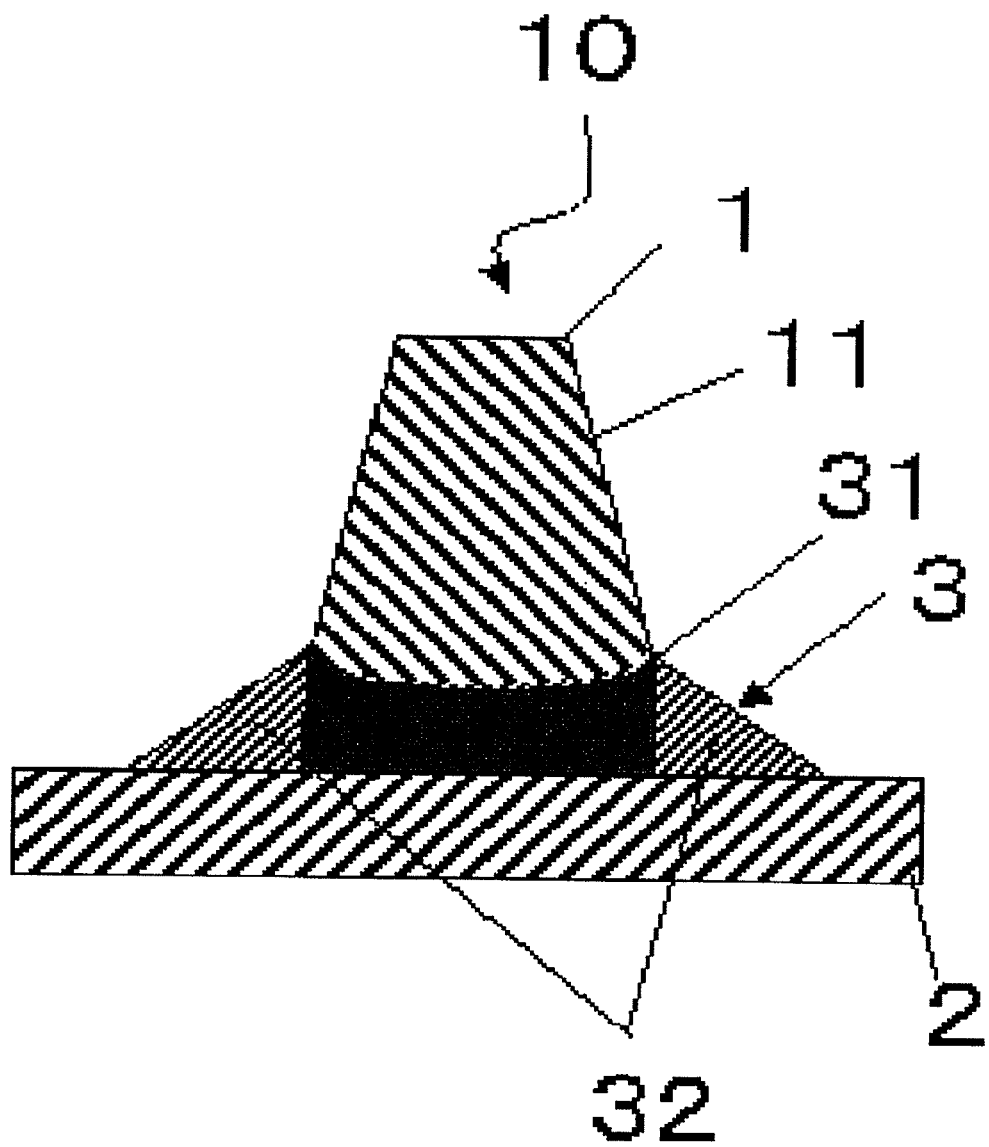
FIG. 5 is a cross-sectional view showing an example of the joint structure according to the present invention.

FIG. 5 is a cross-sectional view showing an example of the joint structure according to the present invention.

Figure 6:
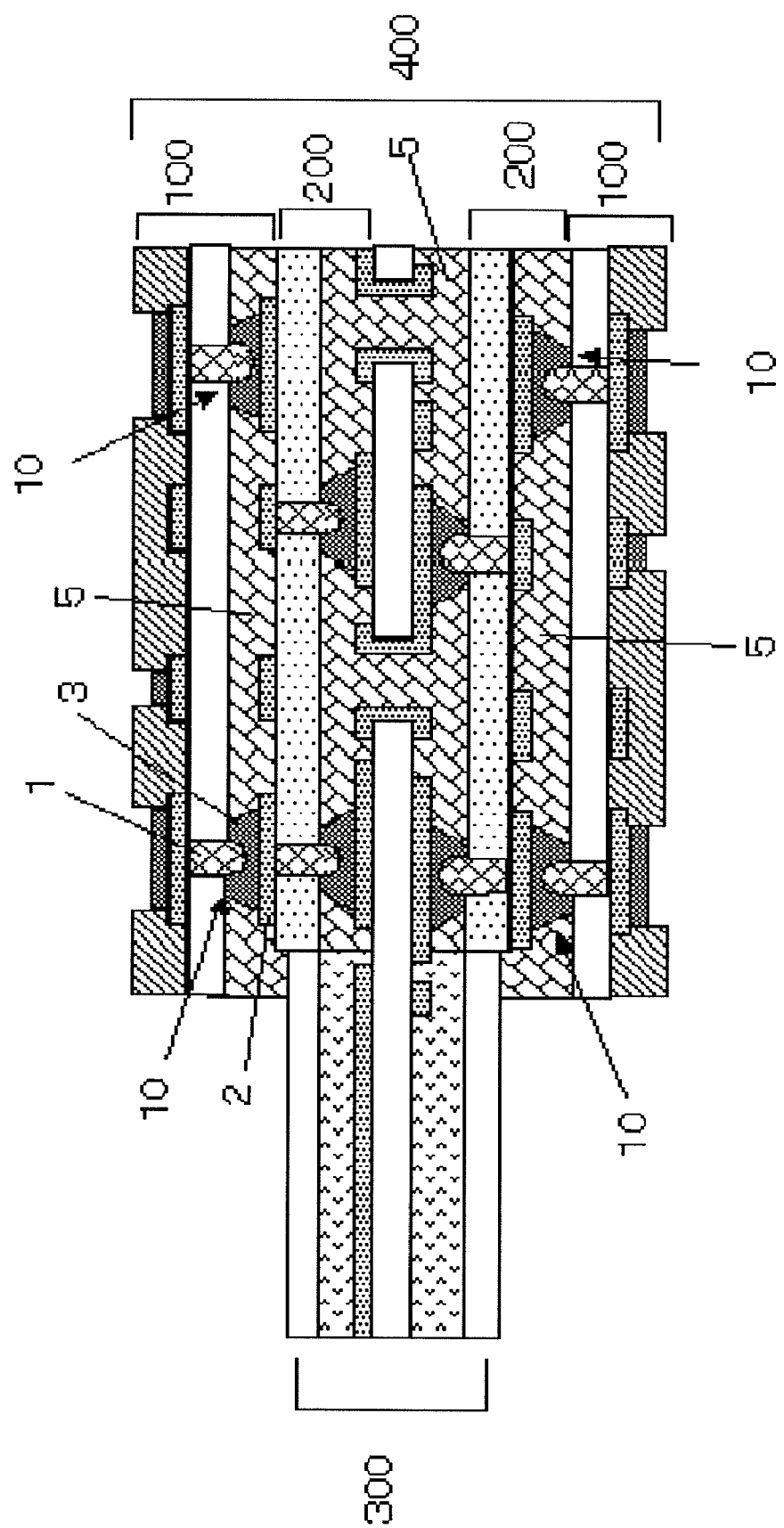
FIG. 6 is a cross-sectional view showing an example of the wiring board having a six-layer structure.

FIG. 6 is a cross-sectional view showing an example of the wiring board having a six-layer structure.

First of all, the joining method is described on the basis of the embodiment shown in the drawings.

In the joining method of a joint structure according to the present invention, the molten state of a brazing material 12 in the fusion welding process is controlled so that the amount of copper atoms contained in the alloy in the central part 31 of the brazing material 12 (joint portion 3), after joining, is higher than that in the outer circumference part 32.

That is, by controlling the molten state of the brazing material 12, copper atoms contained in a conductive member 1 and/or electrode member 2 are diffused into the joint portion 3 to facilitate the alloying ($Cu_6Sn_5$).

In this connection, it is to be noted that the amount of copper atoms contained in the alloy in the central part 31 and the outer circumference part 32 of the joint portion 3 is measured by, for example, atom analysis by X-ray spectroscopy, X-ray photoelectron spectroscopy (XPS), area analysis of Energy-Dispersive X-ray Spectroscopy (EDX) and the like.

The conductive member and the electrode member are generally fusion welded by soldering. The fusion welding by the soldering is performed by reflow soldering. In the joining by reflow soldering, the thermal treatment to melt the solder is performed in a short period of time to prevent deterioration in quality of the substrates and components by heat.

However, when the conductive member and the electrode member are joined together by soldering via such short time thermal treatment, the soldering part can be melted and thereby, disconnected, or the mounted components can be dismounted, owing to shortage of thermal resistance, if re-heated.

The present inventor has conducted studies to prevent the re-melting of the joint portion by re-heating. As a result, it has been found that even in a joint structure joined by a joint portion formed by the fusion welding of a brazing material containing tin as a major component thereof and containing substantially no copper, if the amount of copper atoms contained in the alloy in the central part of the joint portion is higher than that in the outer circumference part, it is possible to have a high connection reliability between a conductive member and an electrode member and a superior thermal resistance of the connection between layers.

Figure 1:
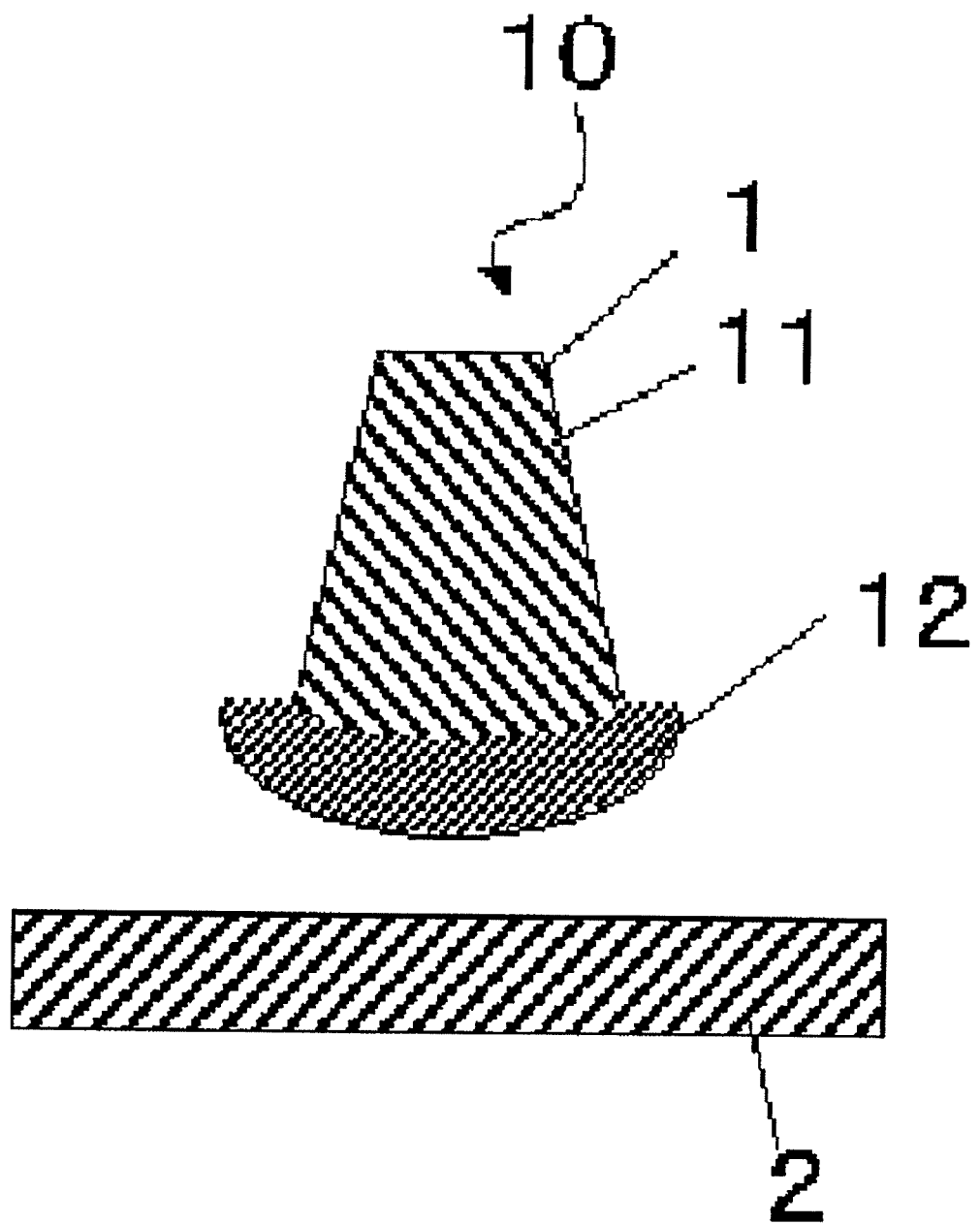
FIG. 1 is a cross-sectional view to explain the process for joining a conductive member and an electrode member.

As shown in FIG. 1, a conductive member 1 having a brazing material 12 at the end and an electrode member 2 are fusion welded with the brazing material 12 to form a joint portion 3, as shown in FIG. 5, thereby enabling to obtain a joint structure 10.

Here, an adhesive having flux activity may be interposed between the brazing material 12 and the electrode member 2 to fusion weld the brazing material 12 and the electrode member 2. For example, the adhesive having flux activity may be applied on the surface of the brazing material 12 or on the surface of the electrode member 2.

The adhesive having flux activity functions to reduce the oxide layer on the surface of the brazing material 12 and the oxide layer on the surface of the electrode member 2. Therefore, when the brazing material 12 and the electrode member 2 are fusion welded, by removing (reducing) the oxide layer of the brazing material 12 and the oxide layer of the electrode member 2, the brazing material 12 and the electrode member 2 can be firmly joined together and electrical resistance can be reduced.

Also, the adhesive having flux activity need not be removed by washing after the brazing material 12 and the electrode member 2 are joined to each other and thus, the production process can be simplified. Further, the adhesive having a flux property exhibits excellent adhesion by heating and can be used as an interlayer member formed between the conductive member 1 and the electrode member 2.

The adhesive having a flux property may comprise, for example, an epoxy resin, a hardening agent, a reducing agent and a film-forming resin.

The epoxy resin may be either an epoxy resin which is in a solid state at room temperature or an epoxy resin which is in a liquid state at room temperature. Also, the epoxy resin may include both an epoxy resin which is in a solid state at room temperature or an epoxy resin which is in a liquid state at room temperature. Therefore, the degree of freedom in designing melting behavior of the resin can be further increased.

Examples of the epoxy resin which is in a solid state at room temperature include, but not limited to, bisphenol A epoxy resins bisphenol A epoxy resins, bisphenol S epoxy resins, phenol novolak epoxy resins, cresol novolak epoxy resins, glycidylamine epoxy resins, glycidylester epoxy resins, alkylphenol epoxy resins having biphenyl skeleton, naphthalene skeleton or dicyclopentadiene skeleton, tri-functional epoxy resins, tetra-functional epoxy resins and the like. Particularly, it includes preferably solid tri-functional epoxy resins and cresol novolak epoxy resins.

Examples of the epoxy resin which is in a liquid state at room temperature include bisphenol A epoxy resins or bisphenol F epoxy resins. A mixture of the foregoing compounds can also be used.

Examples of the hardening agent include those which are commonly used and have flux activity, phenols, amines, thiols and the like. Among them, the hardening agent having flux activity is preferably used since it can remove the oxide layer on the brazing material 12.

The hardening agent having flux activity functions to reduce the oxide layer on the surface of the brazing material 12 (solder) to an extent, at which the oxide layer can be electrically bonded to the electrode member 2, and is a compound having a functional group capable of bonding with a resin. Therefore, the hardening agent having flux activity can be suitably selected according to the type of the brazing material 12 (solder) to be used, considering the removal of the oxide layer on the surface of the brazing material 12 upon adhesion to the brazing material 12.

Examples of the hardening agent having flux activity include compounds containing at least two carboxyl groups, compounds containing a carboxyl group and a functional group capable of curing with a resin (for example, (phenolic) hydroxyl group, amino group and the like) and the like. The compounds containing at least two carboxyl groups include carboxyl acids, for example, alkylcarboxyl acids having a straight- or branched-chain, aromatic carboxyl acids and the like.

Examples of the alkylcarboxyl acids include compounds represented by the following formula I.

$$HOOC-(CH_2)_n-COOH \quad \text{(Formula I)}$$

in which n is an integral number of 0 to 20.

Also, n in the formula I is preferably 4 to 10 because of flux activity, outgas upon adhesion and elasticity and glass transition temperature after curing of the adhesive. By n of at least 4, it is possible to inhibit the increase of the elasticity after curing of the adhesive having flux activity which may be caused by the too short distance between cross-linkages of the epoxy resin and to improve the adhesion to the electrode member 2. Also, by n of up to 10, it is possible to inhibit the decrease of the elasticity which may be caused by the too long distance between cross-linkages of the epoxy resin and to improve the connection reliability between the brazing material 12 and the electrode member 2.

Examples of the compound represented by the formula I include adipic acid of $HOOC-(CH_2)_4-COOH$ (n=4), sebacic acid of $HOOC-(CH_2)_8-COOH$ (n=8) and $HOOC-(CH_2)_{10}-COOH$ (n=10).

The aromatic carboxyl acid preferably includes those further containing carboxyl group and phenolic hydroxyl group. Specifically, a compound containing at least two phenolic hydroxyl groups in a molecule and at least one carboxyl group directly bonded to the aromatic ring in a molecule can be preferably used. Examples of such compounds include benzoic acid derivatives such as salicylic acid, shikimic acid, vanillinic acid, Senda-chrome AL, 1,2-dicarboxy-cis-4,5-dihydroxycyclohexa-2,6-diene, 2,3-dihydroxy dihydroxybenzoic acid, 2,4-dihydroxybenzoic acid, gentisicacid(2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as 1,4-dihydroxy-2-naphthoic acid, 3,5-dihydroxy-2-naphthoic acid, 3,7-dihydroxy-2-naphthoic acid and the like; phenolphthalein; and diphenolic acid.

For example, when the resin comprises an epoxy resin, the hardening agent having flux activity contains a functional group capable of reacting with a carboxyl group and an epoxy group. Examples of the functional group capable of reacting with the epoxy group includes carboxyl group, hydroxy group, amino group and the like. More particularly, when the resin comprises an epoxy resin, the hardening agent having flux activity is preferably at least one of phenolphthalein, sebacic acid and gentisic acid.

Also, the hardening agent having flux activity can be used along with an additional hardening agent (including a resin acting as a hardening agent). When the resin is an epoxy resin, phenols can be suitably used, considering activity and properties after curing.

The phenol, although not particularly limited, is preferably di-functional, considering properties after curing of the adhesive having flux activity and includes, for example, bisphenol A, tetramethylbisphenol A, diallylbisphenol A, biphenol, bisphenol F, diallylbisphenol F, trisphenol, tetrakisphenol, phenol novolaks, cresolnovolaks and the like. Considering melting viscosity, reactivity with the epoxy resin and properties after curing, phenol novolaks and cresol novolaks can be suitably used.

Also, the hardening agent is preferably added in an amount of 0.1 to 30% by weight based on the resin solid content, particularly preferably 1 to 25% by weight based on the resin solid content. If the hardening agent is added in an amount less than the lower limit of the foregoing range, the oxide layer on the surface of the electrode member 2 cannot be reduced and thereby, the joint strength between the brazing material 12 and the electrode member 2 is not sufficient. If the hardening agent is added in an amount greater than the upper limit of the foregoing range, for example, used as a film type adhesive, handling may not be good in terms of film performance.

The reducing agent can be added to improve the flux activity. For example, when a common hardening agent such as a phenol is used as the hardening agent, the addition of the reducing agent allows the expression of the flux activity. Also, when the hardening agent having flux activity is used, the reducing agent acts as a fluxing agent to further improve the flux activity. Therefore, when the hardening agent having flux activity is used, the reducing agent may be omitted.

Examples of such reducing agent include compounds having a carboxyl group in the molecule such as formic acid, acetic acid, propionic acid, butyric acid, caprylic acid, laulic acid, myristic acid, palmitin acid, stearic acid, acrylic acid and the like, and compounds having a phenolic hydroxyl group in the molecule such as phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tertiary-butylphenol and the like.

Examples of the film-forming resin include, although is not particularly limited, a thermoplastic resin, a thermosetting resin, or a mixture of a thermoplastic resin and thermosetting resin. Among them, in terms of the film formulation and the melting viscosity of the resin, a mixture of a thermoplastic resin and a thermosetting resin is suitably used. More particularly, the resin may comprise an epoxy resin and acryl rubber.

Examples of the thermoplastic resin include, although is not particularly limited, for example, a phenoxy resin, a polyester resin, a polyurethane resin, polyimide resin, a siloxane-modified polyimide resin, a polybutadine, polypropylene, a styrene-butadiene-styrene copolymer, a styrene-ethylene-butylene-stylene copolymer, a polyacetal resin, a polyvinylbutyral resin, a polyvinylacetal resin, a butyl rubber, a chloroprene rubber, a polyamide resin, acrylonitrilebutadiene copolymer, acrylonitrilebutadiene-acrylic acid copolymer, acrylonitrilebutadiene-styrene copolymer, polyvinylacetate, nylon, acryl rubber and the like. The foregoing resins can be used alone or in a mixture of two or more thereof.

Also, the thermoplastic resin may be a resin having a nitrile group, an epoxy group, a hydroxy group and a carboxyl group to improve adhesion and compatibility to other resins. Its example includes, for example, acryl rubber.

Here, when a phenoxy resin is used as the film-forming resin, it is preferred that the resin has a number average molecular weight of 5000 to 15000. Therefore, the fluidity of the phenoxy resin is inhibited to make the layer thickness uniform. The skeletone may include bisphenol A type, bisphenol F type, biphenyl type and the like, but not be limited thereto, and has a saturated water absorptivity of 1% or less. Thereby, at a high temperature like upon joining and soldering the brazing material 12 and the electrode member 2, it is possible to improve the inhibiting effect on foaming and delamination.

Also, an acryl rubber can be used as a film-forming resin to improve film formation stability in the production of a film type adhesive sheet. As the elasticity of the adhesive sheet is decreased, residual stress between the electrode member 2 (to be adhered) and the adhesive having flux activity can be decreased to improve adherence to the electrode member 2.

Examples of the thermosetting resin include, but is not particularly limited to, an epoxy resin, an oxetane resin, a phenol resin, a (meth)acrylate resin, a unsaturated-polyester resin, a diallylphthalateresin, a maleimide resin and the like. Among them, an epoxy resin having superior curability, storage property, thermal resistance of the cured product, moisture resistance and chemical resistance is suitably used.

Also, the adhesive having flux activity may further comprise a curing catalyst. By including the curing catalyst, the resin can be further securely cured in the production of the adhesive.

The curing catalyst can be properly selected according to the resin type to be used. For example, the curing catalyst may be an imidazole compound having a melting point of at least 150° C. When the imidazole compound has a too low melting point, the adhesive having flux activity is cured before the solder in the brazing material 12 moves to the surface of the electrode member 2, whereby the connection between the brazing material 12 and the electrode member 2 may become unstable or the storage property may be deteriorated. Therefore, the imidazole compound preferably has a melting point of at least 150° C. Examples of the imidazole compound having a melting point of at least 150° C. include 2-phenylhydroxyimidazole, 2-phenyl-4-methylhydroxyimidazole and the like. Meanwhile, the upper limit of the melting point of the imidazole compound is not particularly limited and can be properly set, for example, according to the adhesion temperature of the adhesive.

Also, the adhesive having flux activity may further comprise a silane coupling agent. By the silane coupling agent, it is possible to increase the adhesion of the adhesive having flux activity to the electrode member 2. Examples of the silane coupling agent include an epoxysilane coupling agent, an aromatic amino silane coupling agent and the like. At least one of the foregoing or both of the foregoing can be used.

Further, the adhesive having flux activity may further comprise other components in addition to the above-described components. For example, various additives can be properly added to improve various properties of the resin such as compatibility, stability, workability and the like.

So far, the adhesive having flux activity is described. Examples of the adhesive having flux activity which can be suitably used in the present invention include a composition of (1) a bisphenol A type epoxy resin as an epoxy resin, phenol novolak as a hardening agent, a phenoxy resin as a film-forming resin and phenol phthaleine as a reducing agent, a composition of (2) a bisphenol A type epoxy resin as an epoxy resin, phenol novolak as a hardening agent, a silicone-modified polyimide resin as a film-forming resin and gentisic acid as a hardening agent (hardening agent having flux activity), and a composition of (3) a tri-functional epoxy resin as an epoxy resin, phenol novolak as a hardening agent and sebacic acid as a hardening agent having flux activity and acryl rubber as a film-forming resin.

Figure 2:
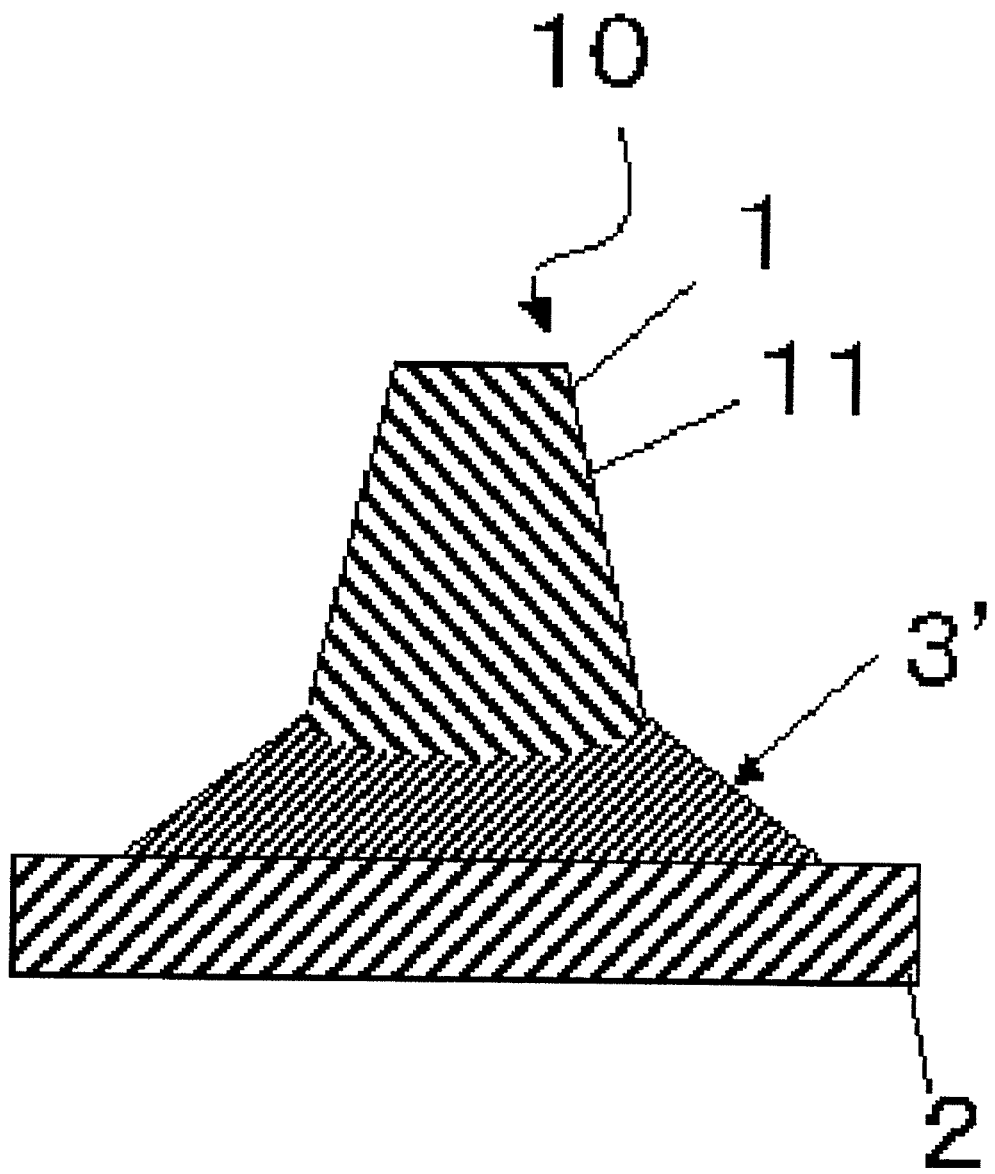
FIG. 2 is a cross-sectional view to explain the process for joining a conductive member and an electrode member.

Referring to FIG. 2, a conductive member 1 containing copper as a major component thereof and an electrode member 2 containing copper as a major component thereof are fusion welded with a brazing material 12 containing tin as a major component thereof and containing substantially no copper to form a fillet 3' (a part to be a joint portion 3 finally). As a result, the conductive member 1 and the electrode member 2 are electrically connected.

By heating the joint structure 10, copper is diffused from the surface of the conductive member 1 and the surface of the electrode member 2 to form an alloy with tin (copper-tin alloy) contained in the fillet 3', in which the amount of copper contained in the fillet (interconnection) 3' is not different between the central part 31 and the outer circumference part 32.

The fusion welding temperature is not particularly limited, as long as the brazing material 12 can melt. For example, it is preferably 25° C. higher than the melting point of the brazing material 12, particularly 30 to 50° C. higher than the melting point of the brazing material 12. By the temperature within the foregoing range, the diffusion of the copper atoms can be promoted.

Specifically, for example, when the brazing material 12 is comprised of a blend of 95 to 99.5% by weight of tin and 0.5 to 5% by weight of silver, the fusion welding temperature is preferably in the range of 220 to 270° C., and more preferably in the range of 230 to 265° C.

The fusion welding is performed by, for example, the pressing process, the soldering reflow process and the like. Among them, the pressing process is preferable, since it undergoes the steps described below. When the joint portion 3 is formed by pressing, it is preferable to perform the pressing under a pressureless or low-pressure condition. Therefore, it is possible to prevent deformation of the joint portion 3 and thereby, reduce distortion of the wiring board.

Figure 3:
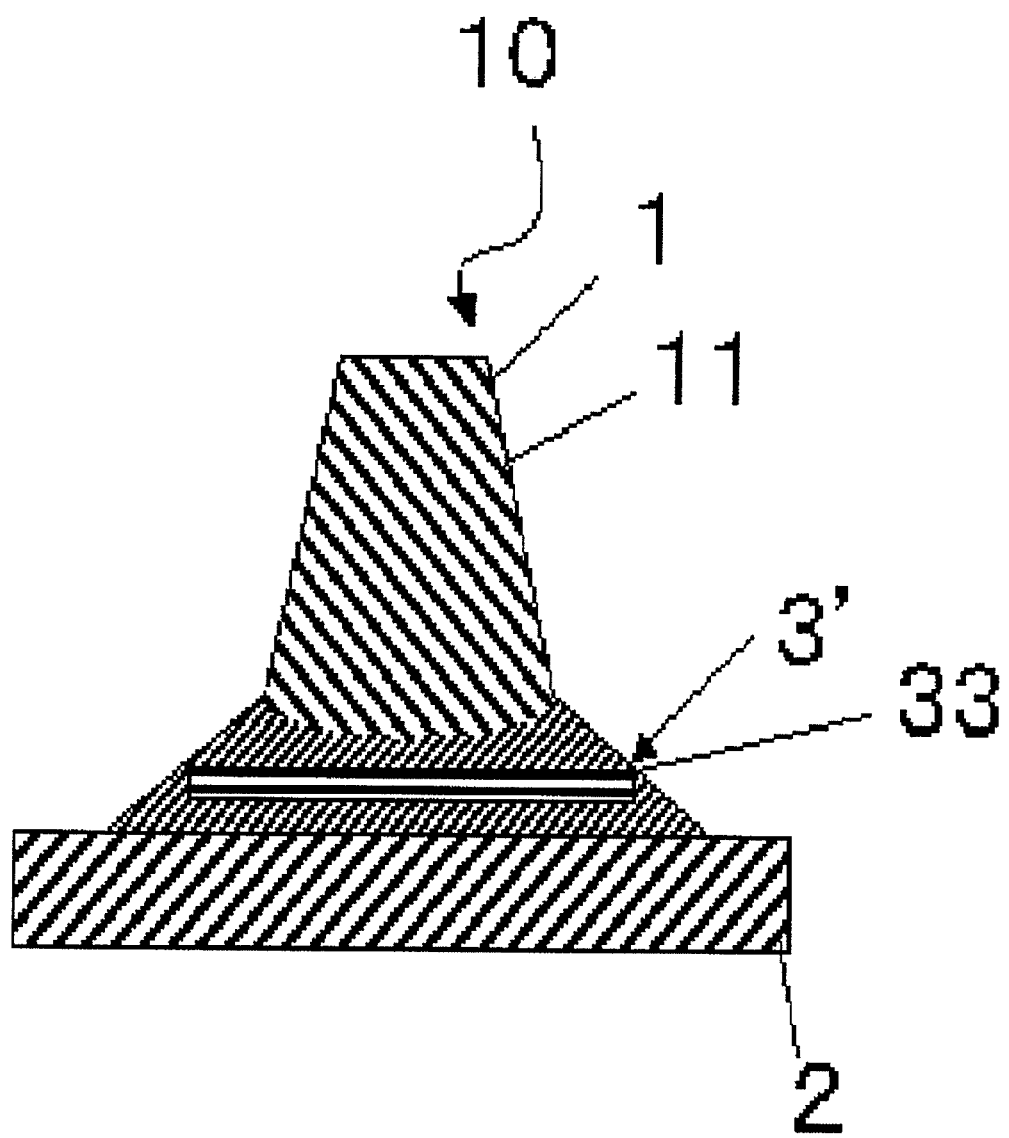
FIG. 3 is a cross-sectional view to explain the process for joining a conductive member and an electrode member.

Then, the joint portion 3 with the fillet 3' formed is subjected to the primary heating. As shown in FIG. 3, since the diffusion of the copper atoms inside the fillet 3' is not sufficient, a layer 33 (a film shaped alloy part) having a content of copper atoms of 15 atom % is formed (first step). The amount of copper atoms contained in other parts of the fillet 3' is higher than 15 atom %.

The primary heating temperature is not particularly limited, but is preferably a temperature, at which the fillet 3' is melted, that is, a temperature higher than the melting point of the fillet 3'. For example, it is preferably at least 25° C. higher, particularly 30 to 50° C. higher, than the melting point of the brazing material 12 forming the fillet 3' (joint portion 3). By setting the primary heating temperature within the foregoing range, the alloying of the tin atoms and the copper atoms (copper-tin alloy) can be promoted.

Particularly, for example, when the brazing material 12 is comprised of a blend of 95 to 99.5% by weight of tin and 0.5 to 5% by weight of silver, the fusion welding temperature is preferably in the range of 220 to 270° C., and more preferably in the range of 230 to 265° C.

The primary heating time may vary with relation to the heating temperature, but it preferably in the range of 10 to 40 seconds, and more preferably in the range of 15 to 30 seconds. By setting the time within the foregoing range, the copper atoms of the conductive member 1 or the electrode member 2 can diffuse inside the fillet 3'.

Figure 4:
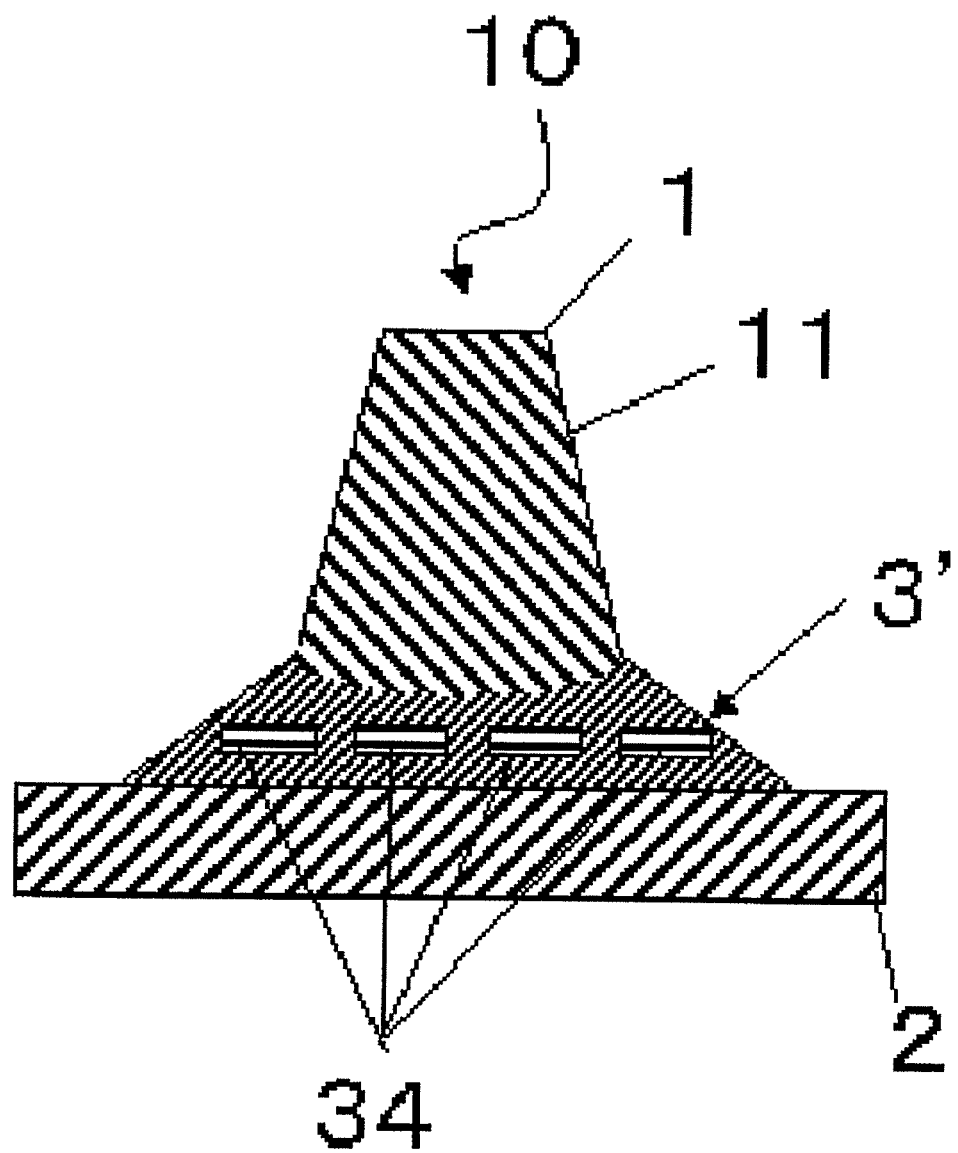
FIG. 4 is a cross-sectional view to explain the process for joining a conductive member and an electrode member.

Further, the secondary heating is performed in the state that the fillet 3' is formed. Therefore, the copper atoms from the conductive member 1 and the electrode member 2 are further diffused into the layer (film shaped alloy part) 33 so that the continuous layer 33 is broken to be an island shape (island shaped alloy parts) from the film shape. Consequently, as shown in FIG. 4, it forms an island shaped alloy parts each having a content of copper atoms of up to 15 atom % (second step).

The secondary heating temperature is not particularly limited but is preferably a temperature, at which the fillet 3' is melted, that is a temperature higher than the melting point of the fillet 3' (joint portion 3). For example, it is preferably at least 25° C. higher, particularly 30 to 50° C. higher, than the melting point of the brazing material 12 forming the fillet 3' (joint portion 3). By the secondary heating temperature within the foregoing range, the diffusion of copper atoms is further promoted and the alloying of the tin atoms and the copper atoms (copper-tin alloy) can be progressed to the central part of the joint portion 3.

Particularly, for example, when the brazing material 12 is comprised of a blend of 95 to 99.5% by weight of tin and 0.5 to 5% by weight of silver, the fusion welding temperature is preferably in the range of 220 to 270° C., and more preferably in the range of 230 to 265° C.

The secondary heating time may vary with relation to the heating temperature, but it is preferably in the range of 5 to 125 seconds, and more preferably in the range of 20 to 120 seconds. By setting the time within the foregoing range, the copper atoms of the conductive member 1 or the electrode member 2 can diffuse sufficiently deep inside the fillet 3'.

In addition, the tertiary heating is performed in the state that the fillet 3' is formed. As the copper atoms are further diffused, the island shaped alloy parts 34 disappear and ultimately, as shown in FIG. 6, the amount of copper atoms contained in the alloy in the central part 31 of the fillet 3' (joint portion 3) is higher than that in the outer circumference part 32 (third step).

The tertiary heating temperature is not particularly limited but is preferably a temperature, at which the fillet 3' is melted. For example, it is preferably at least 25° C. higher, particularly 30 to 50° C. higher, than the melting point of the brazing material 12 forming the fillet 3' (joint portion 3). By the tertiary heating temperature within the foregoing range, the alloying is further diffused into the whole of the central part of the joint portion 3 and the formation of the intermediate $Cu_6Sn_5$ of the alloy ($Cu_3Sn$) (copper-tin alloy) to be ultimately produced is promoted.

Particularly, for example, when the brazing material 12 is comprised of a blend of 95 to 99.5% by weight of tin and 0.5 to 5% by weight of silver, the fusion welding temperature is preferably in the range of 220 to 270° C., and more preferably in the range of 230 to 265° C.

The tertiary heating time may vary with the relation to the heating temperature, but it is preferably in the range of 5 to 435 seconds, and more preferably in the range of 55 to 235 seconds. By setting the time within the foregoing range, the copper atoms of the conductive member 1 or the electrode member 2 can diffuse deep inside the fillet 3'.

Then, the fillet 3' is cooled and solidified to form the joint portion 3.

It is believed that the reason why the amount of copper atoms contained in the alloy (copper-tin alloy) in the central part 31 of the joint portion 3 to be finally produced is higher than that in the outer circumference part by controlling the molten state of the brazing material 12 is as follows.

As shown in FIG. 2 to FIG. 4, the fillet 3' formed by the brazing material 12 comprises the copper atoms diffused from the conductive member 1 and the electrode member 2, thereby forming a copper-tin alloy. That is, the brazing material is transformed into a copper-tin alloy. If the molten state of the brazing material 12 is maintained for a short period of time, the copper atoms cannot sufficiently diffuse, whereby there is no great difference between the central part 31 and the outer circumference part 32 of the fillet 3'. However, if the molten state of the brazing material 12 is maintained for a relatively long period of time so that the copper atoms can diffuse sufficiently in the central part 31 of the fillet 3', the copper atoms sufficiently diffuse from both the conductive member 1 and the electrode member 2. On the other hand, in the outer circumference part 32 of the fillet 3', the copper atoms can diffuse only from the electrode member 2 since the outer circumference part 32 is not in direct contact with the conductive member 1.

Therefore, as shown in FIG. 5, the amount of copper atoms contained in the alloy in the central part 31 of the joint portion 3 to be finally produced is higher than that in the outer circumference part 32.

Thus, the high amount of copper atoms contained in the alloy in the central part 31 of the joint portion 3 can improve the thermal resistance of the joint portion 3. That is, via promotion of the alloying of the tin atoms and the copper atoms, the melting point of the alloy can be raised. Also, since the thermal resistance of the central part 31 of the joint portion 3 is improved, the connection reliability between the conductive member 1 and the electrode member 2 can be improved. This is because when the thermal resistance of the central part 31 of the joint portion 3 interposed between the conductive member 1 and the electrode member 2 for connection is high, the low thermal resistance of the outer circumference part 32 exerts only a little influence on the connection reliability.

Also, since the brazing material 12 is controlled in the molten state, it is possible to inhibit formation of bubbles, even when the copper atoms diffuse. As compared to the diffusion of the copper atoms when the brazing material 12 is solidified, the diffusion of the copper atoms in the brazing material 12 in the molten state according to the present invention can rapidly proceed to promote the alloying. As a result, the amount of the copper atoms diffusing after solidification can be decreased and the bubble formation can be inhibited.

The control of the molten state of the brazing material 12 has been described by the first to third steps. However, the method for forming the joint structure is not limited thereto.

For example, the first step, the second step and the third step can be performed continuously at once or each step can be performed independently. Preferably, the steps are performed continuously at once. Thus, the joint portion 3 can be efficiently formed.

Also, the heating temperature in each of the first step, the second step and the third step can be the same or different, with the preference being the same. Thus, it is possible to continuously control the molten state.

The method for controlling the fillet 3' (joint portion 3) in the molten state includes the heat treatment by solder reflow after the formation of the fillet 3', the formation of the fillet 3' by pressing, continuous heat treatment after the formation of the fillet 3' by pressing and the like. Among these treatments, the continuous heat treatment is preferred because the diffusion of copper atoms can be accomplished efficiently.

Next, the joint structure will be described.

By the above-described joining method, the joint structure as shown in FIG. 5 can be obtained.

In the joint structure 10 according to the present invention, the amount of copper atoms contained in the alloy in the central part 31 of the joint portion 3 is higher than that in the outer circumference part 32, when the conductive member 1 and the electrode member 2 are joined together by the joint portion 3. That is, the alloying of tin and copper in the central part 31 of the joint portion 3 proceeds from the outer circumference part 32.

As shown in FIG. 5, in the joint structure 10, the joint portion 3 is formed by fusion welding of the brazing material 12 provided at the end part of the protruding electrode 11.

The conductive member 1 and the electrode member 2 are bonded through the joint portion 3.

In this embodiment according to the present invention, the conductive member 1 is a protruding electrode, and it is mainly formed of copper. For example, it comprises mainly a singleton of copper atoms or a copper-based alloy. More specifically, the amount of copper atoms contained therein is preferably 95% or more, particularly 98 to 100%.

In this embodiment according to the present invention, the electrode member 2 is a plate type and it is mainly formed of copper. For example, it comprises mainly a singleton of copper atoms or a copper-based alloy. More specifically, the amount of copper atoms contained therein is preferably 95% or more, particularly 98 to 100%.

The joint portion 3 welds the conductive member 1 on to the electrode member 2 and its cross-section is a trapezoid with the side of the conductive member as the upper side.

The amount of copper atoms contained in the alloy in the central part 31 of the joint portion 3 is higher than that in the outer circumference part 32. Therefore, the joint portion 3 has an improved thermal resistance. Specifically, the central part 31 has excellent thermal resistance and thereby contributes to the improvement of connection reliability.

The central part 31 refers the part interposed between (in contact with both) the conductive member 1 and the electrode member 2. On the other hand, the outer circumference part 32 refers the part in contact with the electrode member 2 but not with the conductive member 1.

Thus, it is believed that the reason why the amount of copper atoms contained in the alloy (copper-tin alloy) in the central part 31 is higher than that in the outer circumference part 32 is as follows.

Since the central part 31 is in contact with (is integrally formed with) both the conductive member 1 and the electrode member 2, copper atoms are diffused from the both sides. On the other hand, the outer circumference part 32 is only in contact with (integrally formed with) the electrode member 2 (and the central part), and thus copper atoms are diffused only from the electrode member 2 (and the central part). Accordingly, as compared to the outer circumference part 32, the amount of copper atoms contained in the central part 31 is high.

The amount of copper atoms contained in the alloy in the central part 31 of the joint portion 3 is not particularly limited, as long as it is higher than that in the outer circumference part 32, but is preferably 30 atom % or more, particularly 40 to 80 atom %. If the contained amount of copper atoms is within the foregoing range, the thermal resistance is excellent.

The difference [S1–S2] of the amount [S1] of copper atoms contained in the alloy in the in the central part 31 of the joint portion 3 and the amount [S2] of copper atoms contained in the alloy in the outer circumference part 32 is not particularly limited, but is preferably 10 atom % or more, particularly 25 to 60 atom %. If the difference is within the foregoing range, the thermal resistance is further improved and the re-melting of the joint portion 3 by reflow heat is inhibited, leading improvement in reliability.

The brazing material 12 forming the joint portion 3 is mainly formed of tin and contains substantially no copper.

A specific example includes a blend of 95 to 99.5% by weight of tin and 0.5 to 7% by weight of silver, preferably a blend of 97.5% by weight of tin and 2.5% by weight of silver and a blend of 96.5% by weight of tin and 3.5% by weight of silver.

Next, the wiring board will be described.

The wiring board according to the present invention comprises the joint structure 10 as described above.

Now, a suitable embodiment (6-layer flexible wiring board) is described in detail with reference to the attached drawings.

As shown in FIG. 6, a six-layer flexible wiring board 400 comprises inner circuit substrates 200 laminated on both sides (upper and lower sides in FIG. 6) of a core circuit substrate 300.

Then, outer circuit boards 100 are laminated on both the outer surfaces of the inner circuit substrates 200 (upper and lower sides in FIG. 6).

Here, the bonding between the core circuit substrate 300 and each of the inner circuit substrates 200 is made using the joint structure 10 comprising the joint portion 3. Therefore, the amount of copper atoms contained in the alloy in the central part of the joint portion 3 is higher than that in the outer circumference part.

Also, the bonding between each inner circuit substrate 200 and each outer circuit substrate 100 is made using the joint structure 10 comprising the joint portion 3. Therefore, the amount of copper atoms contained in the alloy in the central part of each joint portion 3 is higher than that in the outer circumference part thereof.

Next, the method for producing a wiring board will be described.

The method for producing a wiring board according to the present invention is to produce a first substrate having a wiring board comprising a conductive member containing copper as a major component thereof and a second substrate having an electrode member containing copper as a major component thereof, in which the conductive member and the electrode member are fusion welded using a brazing material containing tin as a major component thereof and containing substantially no copper and the molten state of the brazing material in the fusion welding is controlled so that the amount of copper atoms contained in the alloy in the central part of the brazing material after the fusion welding is higher than that in the outer circumference part.

So far, the joint structure and the method for producing the same, and the wiring board and the method for producing the same according to the present invention are described based on the suitable embodiments. However, the present invention is not limited thereto and the construction of each part can be substituted with any structure which has the same function.

For example, although the protruding electrode is used as the conductive member 1, the present invention is not limited thereto, and the conductive member 1 may comprise a conductive resin paste and a copper paste (containing substantially no resin) and the like.

Also, in addition to the six-layer flexible wiring board, multi-layer wiring boards having less than 6 layers such as 2 layers, 3 layers and the like or multi-layer wiring boards having more than 6 layers such as 7 layers, 8 layers and the like can be used as the wiring board.

EXAMPLES

Hereinafter, the present invention will be described in further detail with reference to examples. It is to be understood, however, that these examples are for illustrative purposes only and are not to be construed to limit the scope of the present invention.

Example 1

First Substrate

Preparation of Outer Circuit Board

An aperture having a diameter of 50 μm was formed on an insulation substrate of polyimide resin having a thickness of 25 μm from the surface of the insulation substrate side of a first substrate (commercially available from UBE INDUSTRIES, LTD. under the trade name Upicel SE1310) with a copper foil having a thickness of 12 μm attached thereon by UV laser radiation and desmeared by a dry desmearing apparatus. The electrolytic copper plating was performed on the aperture to form a copper post as a conductive member to a height of 10 μm from the surface of the insulation layer opposite to the side with the copper foil attached. Then, a brazing material (solder, a blend of 97.5% by weight of tin and 2.5% by weight of silver) was plated to a thickness of 15 μm to form a conductive post. Thereafter, the copper foil was etched to form a wiring pattern. Next, a thermoplastic adhesive sheet having flux activity (thickness of 25 μm, a sheet type interlayer adhesive supplied from SUMITOMO BAKELITE Co., Ltd.) was laminated by a vacuum laminating apparatus and shaped into a laminate size of 120×170 mm to obtain a first substrate (outer circuit substrate) 100.

The adhesive sheet having flux activity was comprised of 45 parts by weight of bisphenol A epoxy (840S), 21 parts by weight of phenol novolak (commercially available from SUMITOMO BAKELITE Co., Ltd. under the trade name PR53647), 28 parts by weight of high thermal resistance phenoxy (commercially available from TOHTO CHEMICAL Com. under the trade name YL-6954), 14 parts by weight of phenolphthaleine, 0.01 parts by weight of imidazole, 1 parts by weight of aliphatic epoxysilane (commercially available from Nippon Unicar Co., Ltd. under the trade name A18), and acetone, MEK and DMAc as solvents.

Second Substrate a

Preparation of Inner Circuit Board

An aperture having a diameter of 50 μm was formed on an insulation substrate of polyimide resin having a thickness of 25 μm from the surface of the insulation substrate side of a second substrate a (commercially available from UBE INDUSTRIES LTD. under the trade name Upicel SE1310) with a copper foil having a thickness of 12 μm attached thereon by UV laser radiation and desmeared by a dry desmearing apparatus. The electrolytic copper plating was performed on the aperture to form a copper post as a conductive member to a height of 10 μm from the surface of the insulation layer opposite to the side with the copper foil attached and a brazing material (solder, a blend of 97.5% by weight of tin and 2.5% by weight of silver) was plated to a thickness of 15 μm to form a conductive post. Then, the copper foil was etched to form a wiring pattern and a pad as an electrode member to support the conductive post which is the conductive member of the first substrate. A thermoplastic adhesive sheet having flux activity (thickness of 25 μm, a sheet type interlayer adhesive supplied from SUMITOMO BAKELITE Co., Ltd.) was laminated by a vacuum laminating apparatus and shaped into a laminate size of 120×170 mm to obtain a second substrate a (inner circuit substrate) 200.

Second Substrate b

Preparation of Circuit Substrate as a Core

A second substrate b (core member) comprising an insulation substrate of polyimide resin having a thickness of 25 μm with copper foils having a thickness of 12 μm attached on both sides of the insulation substrate (commercially available from Mitsui Chemicals, Inc. under the trade name NEX23FE (25T)) was perforated using a drill to form through holes and subjected to the direct plating and electrolytic copper plating so that its inside and outside were electrically connected. Then, the copper foil was etched to form a wiring pattern and a pad as an electrode member to support the conductive post which is the conductive member.

A coverlay film comprising a polyimide layer having a thickness of 12.5 µm coated with an epoxy resin-based adhesive to a thickness of 25 µm (commercially available from Arisawa Manufacturing Co., Ltd. under the trade name CVA0525) was applied on the wiring pattern of the part corresponding to the flexible part to form a surface coating layer. Finally, the laminate was cut to a size of 120×170 mm to obtain the second substrate b (circuit substrate as a core) 300.

Preparation of Multi-Layer Flexible Circuit Substrate

1. Lamination

The first substrate (outer circuit substrate) 100, the second substrate a (inner circuit substrate) 200, the second substrate b (circuit substrate as a core) 300, the second substrate a (inner circuit substrate) 200, and the first substrate (outer circuit substrate) 100 were laid on sequentially by using a zig provided with a finger guide for positioning. The laminate was heated by using a spot heater partially to a temperature of 200° C. to partially pre-bond the first substrate 100, the second substrate a 200 and the second substrate b 300 for positioning.

Then, the laminate was heated and compressed at a temperature of 150° C. and a pressure of 0.5 MPa for 60 seconds using a vacuum press until the conductive post came to contact with the conductive pad. Here, the adhesive should be charged without bubbles around the circuits on the second substrate a (inner circuit substrate) 200 and the second substrate b (circuit substrate as a core) 300 where the conductive pad was provided.

2. Joining

The laminate was heated by using a press under the following condition so that the adhesive having flux activity exhibited its flux activity, whereby the oxide layer on the brazing material 12 and the oxide layer on the electrode member 2 were removed (reduced) to join the brazing material 12 and the electrode member 1.

The heating condition was set so that the laminate was heated from room temperature to 260° C. and the heating rate was set to 100° C./min. The maximum temperature was set to 265° C. The heating was carried out at 260° C. or higher for 300 seconds (the first step for 30 seconds, the second step for 90 seconds and the third step for 180 seconds).

Here, the joining was performed at a pressure of 0.1 MPa. The joining of the conductive post and the conductive pad by soldering was accomplished by a solder fillet formed by fusion welding the solder.

The amount of copper atoms contained in the central part of the joint portion was 55 atom % and the amount of copper atoms contained in the outer circumference part was 25 atom %, with the difference of 30 atom %.

The amount of copper atoms was estimated by area analysis of EDX. The amount of copper atoms contained in the central part was an average value of the areas of 3×30 µm and the amount of copper atoms contained in the outer circumference part was an average value of the areas of 5×10 µm.

3. Curing

The laminate was heated at 180° C. for 60 minutes to harden the adhesive having flux activity. An adhesive layer 5 was obtained.

4. Surface Treatment of the Outer Layer

On the outer surfaces of both outer layers, a liquid type resist (commercially available from Hitachi Chemical Co., Ltd. under the trade name SR9000W) was printed, exposed and developed to form a surface coating and apertures were also formed thereon. Then, the apertures were subjected to gold plating for surface treatment to finally obtain a multi-layer flexible circuit substrate of six layers.

Example 2

Except that the heating in the joining process was performed under the following heating condition, the same procedure as described in the Example 1 was performed.

The laminate was heated from room temperature to 250° C. and the heating rate was set to 100° C./min. The maximum temperature was set to 255° C. The heating temperature was kept at 250° C. or higher for 300 seconds (the first step for 30 seconds, the second step for 90 seconds and the third step for 180 seconds).

The amount of copper atoms contained in the central part of the joint portion was 50 atom % and the amount of copper atoms contained in the outer circumference part was 20 atom %, with the difference of 30 atom %.

Example 3

Except that the heating in the joining process was performed under the following heating condition, the same procedure as described in the Example 1 was performed.

The laminate was heated from room temperature to 260° C. and the heating rate was set to 100° C./min. The maximum temperature was set to 265° C. The heating temperature was kept at 260° C. or higher for 240 seconds (the first step for 30 seconds, the second step for 90 seconds and the third step for 120 seconds).

The amount of copper atoms contained in the central part of the joint portion was 50 atom % and the amount of copper atoms contained in the outer circumference part was 30 atom %, with the difference of 20 atom %.

Example 4

Except that the heating in the joining process was performed under the following heating condition, the same procedure as described in the Example 1 was performed.

The maximum temperature was set to 265° C. The heating temperature was kept at 260° C. or higher for 180 seconds (the first step for 30 seconds, the second step for 90 seconds and the third step for 60 seconds).

The amount of copper atoms contained in the central part of the joint portion was 45 atom % and the amount of copper atoms contained in the outer circumference part was 30 atom %, with the difference of 15 atom %.

Example 5

Except that the brazing material was comprised of a blend of 96.5% by weight of tin and 3.5% by weight of silver, the same procedure as described in the Example 1 was performed.

The amount of copper atoms contained in the central part of the joint portion was 50 atom % and the amount of copper atoms contained in the outer circumference part was 30 atom %, with the difference of 20 atom %.

Comparative Example 1

Except that the heating in the joining process was performed under the following heating condition, the same procedure as described in the Example 1 was performed.

The maximum temperature was set to 265° C. The heating temperature was kept at 260° C. or higher for 15 seconds.

The amount of copper atoms contained in the central part of the joint portion was 25 atom % and the amount of copper atoms contained in the outer circumference part was 25 atom %, with the difference of 0 atom %.

Each circuit board obtained from the Examples and the Comparative Example was evaluated as follows. The evaluation categories are described below. The result is shown in Table 1.

1. Thermal Resistance

The thermal resistance was evaluated by inspecting the outer appearance and measuring the on-resistance after the thermal shock test (hot oil at 260° C. for 10 seconds at room temperature for 20 seconds, 100 cycles) had been performed.

A: The outer appearance was in good condition without abnormality and the change in the on-resistance from the initial value was less than ±5%.

B: The outer appearance was in good condition without abnormality and the change in the on-resistance from the initial value was greater than ±5% but less than ±8%.

C: The outer appearance was in good condition without abnormality and the change in the on-resistance from the initial value was greater than ±8% but less than ±10%.

D: Some swells and exfoliation were observed or the change in the on-resistance from the initial value was greater than ±10%. In the initial state, it did not electrically operate.

2. Connection Reliability

The connection reliability was evaluated by inspecting the cross-section and measuring the on-resistance after the treatment at 150° C. for 1000 hours.

A: Some bubbles were observed in the joint portion but the area was less than 5% of the entire area and the change in the resistance between the initial state and after the treatment was less than ±5%.

B: Some bubbles were observed in the joint portion but the area was less than 5% of the entire area and the change in the resistance between the initial state and after the treatment was greater than ±5% and less than ±8%.

C: Some bubbles were observed in the joint portion but the area was less than 5% of the entire area and the change in the resistance between the initial state and after the treatment was greater than ±8% and less than ±10%.

D: Much bubbles were observed in the joint portion but the area was greater than 5% of the entire area. The change in the resistance between the initial state and after the treatment was greater than ±10%. In the initial state, it did not electrically operate.

3. Adhesion

The adhesion was evaluated according to the peel strength test JIS C 5016.

A: Greater than 1.0 N/mm.
B: Greater than 0.7 N/mm and less than 1.0 N/mm.
C: Greater than 0.5 N/mm and less than 0.7 N/mm.
D: Less than 0.5 N/mm.

4. Distortion of Wiring Board

The distortion of the wiring board was evaluated by inspecting the cross-section and measuring the on-resistance.

A: Little swell was observed in the layer and there was no break.

B: Some swells were observed in the layer and there was no break.

C: Some swells were observed in the layer and there were up to 3 breaks.

D: Some swells were observed in the layer and there were up to 4 breaks.

TABLE 1

| | Exam. 1 | Exam. 2 | Exam. 3 | Exam. 4 | Exam. 5 | Comp. Exam. 1 |
|---|---|---|---|---|---|---|
| Thermal resistance | A | A | B | B | A | B |
| Connection reliability | A | A | B | B | B | D |
| Adhesion | A | A | A | A | A | A |
| Distortion of wiring board | A | A | A | A | A | A |

As clearly shown from Table 1, the Example 1 to the Example 5 showed superior thermal resistance, connection reliability, adhesion and small distortion of the wiring board.

Particularly, the Example 1 and the Example 2 showed excellent thermal resistance and connection reliability. Therefore, it was noted that even after re-heating was performed after the fusion welding had been done, no melting occurred in the joint portion, showing excellent thermal resistance.

INDUSTRIAL APPLICABILITY

The joint structure according to the present invention comprises a conductive member containing copper as a major component thereof, an electrode member containing copper as a major component thereof, and a joint portion formed by fusion welding the conductive member and the electrode member with a brazing material containing tin as a major component thereof and containing substantially no copper, wherein the amount of copper atoms contained in the alloy in the central part of the joint portion is higher than that in the outer circumference part thereof. Therefore, according to the present invention, it is possible to obtain a joint structure having a high connection reliability between the conductive member and the electrode member and superior thermal resistance of a joint portion between layers. The joint structure has industrial applicability.

The invention claimed is:

1. A joint structure, comprising:
a conductive member containing copper as a major component thereof;
an electrode member containing copper as a major component thereof; and
a joint portion through which the conductive member and the electrode member are joined together, the joint portion consisting of a central part integrally formed with both the conductive member and the electrode member and an outer circumference part integrally formed with the central part so as to surround the central part, the outer circumference part being integrally formed with only the central part and the electrode member, wherein both the central part and the outer circumference part of the joint portion are formed of a copper-tin alloy obtained by melting a brazing material containing tin as a major component thereof and containing substantially no copper, and diffusing copper atoms of the copper contained in the conductive member and the electrode member into the brazing material;

a concentration of copper atoms in the central part is higher than that in the outer circumference part and is 40 to 80 atom %; and in the case where the concentration of the copper atoms in the central part is defined as S1, and the concentration of the copper atoms in the outer circumference part is defined as S2, a difference between S1 and S2 (S1−S2) is 10 to 30 atom %.

2. The joint structure as claimed in claim 1, wherein the conductive member is a protruding electrode.

3. The joint structure as claimed in claim 1, wherein the brazing material further contains silver in addition to the tin.

4. A wiring board comprising the joint structure defined by claim 1.

5. A method of manufacturing the joint structure defined by claim 1,
wherein the joint portion is formed by melting the brazing material so that the brazing material is transformed into a copper-tin alloy by controlling a molten state of the brazing material.

6. The method as claimed in claim 5, wherein in the molten state, the brazing material is maintained at a temperature higher than a melting point thereof, and a difference between the temperature and the melting point thereof is 25° C. or higher.

7. The method as claimed in claim 5, wherein in the molten state, the brazing material is maintained at a temperature of a melting point thereof or higher, for 60 seconds or more.

8. A method of manufacturing the joint structure defined by claim 1, the method comprising:
forming a fillet through which the conductive member and the electrode member are joined together by melting the brazing material so that the brazing material is transformed into the fillet;

forming a film shaped alloy part within the fillet by heating the fillet so that copper atoms of the copper contained in the conductive member and the electrode member are diffused into the fillet to allow the tin to be transformed into a copper-tin alloy, wherein a concentration of copper atoms contained in the copper-tin alloy of the film shaped alloy part is 15 atom % or less; and forming island shaped alloy parts by further heating the fillet so that copper atoms of the copper contained in the conductive member and the electrode member are further diffused into the fillet to separate the film shaped alloy part into the island shaped alloy parts, wherein a concentration of copper atoms contained in the copper-tin alloy of each of the island shaped alloy parts is 15 atom % or less.

9. The method as claimed in claim 8, further comprising forming the joint portion by further heating the fillet so that copper atoms of the copper contained in the conductive member and the electrode member are further diffused into the fillet to eliminate the island shaped alloy parts.

10. The method as claimed in claim 8, wherein in the film shaped alloy part forming step, the fillet is brought into a molten state.

11. The method as claimed in claim 8, wherein in the island shaped alloy parts forming step, the fillet is brought into a molten state.

12. The method as claimed in claim 9, wherein in the joint portion forming step, the fillet is brought into a molten state.

13. A method of manufacturing a wiring board comprising joining a first substrate and a second substrate using the joint structure defined by claim 1, such that said first substrate is provided with said conductive member, and said second substrate is provided with said electrode.

* * * * *